United States Patent [19]

Debbaut

[11] Patent Number: 5,357,057

[45] Date of Patent: * Oct. 18, 1994

[54] PROTECTED ELECTRICAL CONNECTOR

[75] Inventor: Christian A. M. Debbaut, Cary, N.C.

[73] Assignee: Raychem Corporation, Menlo Park, Calif.

[ * ] Notice: The portion of the term of this patent subsequent to Jan. 6, 2004 has been disclaimed.

[21] Appl. No.: 933,285

[22] Filed: Aug. 21, 1992

Related U.S. Application Data

[63] Continuation of Ser. No. 396,575, Aug. 21, 1989, Pat. No. 5,140,746, which is a continuation of Ser. No. 183,546, Apr. 18, 1988, Pat. No. 4,864,725, which is a continuation of Ser. No. 38,415, Apr. 9, 1987, abandoned, which is a continuation of Ser. No. 756,559, Jul. 17, 1985, abandoned, which is a continuation of Ser. No. 507,433, Jun. 23, 1983, abandoned, which is a continuation-in-part of Ser. No. 504,000, Jun. 13, 1983, Pat. No. 4,634,207, which is a continuation-in-part of Ser. No. 434,011, Oct. 12, 1982, Pat. No. 4,600,261.

[51] Int. Cl.$^5$ .................. H02G 15/06; H02G 15/10
[52] U.S. Cl. ........................... 174/84 R; 174/76; 174/84 C; 174/87; 174/92
[58] Field of Search ............... 29/855, 858, 868, 749, 29/871, 872, 862; 174/76, 84 C, 84 R, 87, 85, 88 G, 92, 93; 524/157, 267, 491, 848

[56] References Cited

U.S. PATENT DOCUMENTS

| | | | |
|---|---|---|---|
| Re. 30,321 | 7/1980 | Brauer et al. | 260/18 TN |
| Re. 31,389 | 9/1983 | Brauer et al. | 210/321.3 |
| 997,066 | 7/1911 | Krannichfeldt . | |
| 2,815,497 | 12/1957 | Redslob | 339/276 |
| 2,906,810 | 9/1959 | D'Ascoli | 174/84 |
| 3,020,260 | 2/1962 | Nelson | 260/46.5 |
| 3,065,292 | 11/1962 | Chickvary | 174/84 |
| 3,143,595 | 8/1964 | Martin | 174/84 |
| 3,187,088 | 6/1965 | Warner | 174/91 |
| 3,228,820 | 1/1966 | Samson | 156/307 |
| 3,241,095 | 3/1966 | Phillips . | |
| 3,243,211 | 3/1966 | Wetmore | 287/78 |
| 3,427,393 | 2/1969 | Masterson | 174/23 |
| 3,485,787 | 12/1969 | Hacfele et al. | 260/33.6 |
| 3,522,576 | 8/1970 | Cairns . | |
| 3,548,420 | 12/1970 | Spence | 3/20 |
| 3,585,275 | 6/1971 | Gillemot et al. | 174/76 |
| 3,619,481 | 11/1971 | Smith | 174/138 F |
| 3,630,905 | 12/1971 | Sorgo | 260/85.1 |
| 3,649,436 | 3/1972 | Buese | 161/160 |
| 3,676,387 | 7/1972 | Lindlof | 260/28.5 |
| 3,678,174 | 7/1972 | Ganzhorn | 174/84 R |
| 3,708,611 | 1/1973 | Dinger | 174/84 C |
| 3,714,110 | 1/1973 | Verdol et al. | 260/33.6 |
| 3,718,619 | 2/1973 | Rustad | 260/47 B |
| 3,731,258 | 5/1973 | Spicer | 339/48 |
| 3,752,306 | 8/1973 | Thompson et al. | 206/47 A |
| 3,755,241 | 8/1973 | Brady | 260/33.6 |
| 3,755,615 | 8/1973 | Paullus | 174/76 |
| 3,801,532 | 4/1974 | Olstowski | 260/33.8 |
| 3,814,836 | 6/1974 | Neale, Sr. | 174/84 |
| 3,827,999 | 8/1974 | Crossland | 260/33.6 |

(List continued on next page.)

FOREIGN PATENT DOCUMENTS

0046063A1 2/1982 European Pat. Off. .

(List continued on next page.)

OTHER PUBLICATIONS

Brochure: Sylgarde ® 51 Dielectric Gel: Dow Corning Bulletin: 05-2043 Dec., 1967.

(List continued on next page.)

*Primary Examiner*—Morris H. Nimmo

[57] ABSTRACT

An apparatus and method for protection of electrical contacts as well as a process for splicing electrical wires that are to be exposed to an adverse environment. The protection apparatus ensures that the electrical contacts are protected when they are otherwise located in an adverse environment. In a particular embodiment, the apparatus includes a connector, an insulating sleeve adapted to retain the connector, and an encapsulant. The encapsulant, which is disposed with protection apparatus, e.g. the insulating sleeve, has a cone penetration value of 100 to 350 ($10^{-1}$ mm) and an ultimate elongation of at least 200% and preferably an elastic modulus of less than $10^7$ dynes/cm$^2$.

25 Claims, 3 Drawing Sheets

U.S. PATENT DOCUMENTS

| | | | |
|---|---|---|---|
| 3,846,355 | 11/1974 | Mayer | 260/18 |
| 3,853,385 | 12/1974 | Paiazzetti et al. | 339/96 |
| 3,853,805 | 12/1974 | Miller et al. | 260/37 |
| 3,873,757 | 3/1975 | Berke et al. | 174/52 R |
| 3,875,325 | 4/1975 | Anderson et al. | 174/92 |
| 3,879,575 | 4/1975 | Dobbin et al. | 174/76 |
| 3,897,129 | 7/1975 | Farrar . | |
| 3,916,082 | 10/1975 | Gillemot | 174/41 |
| 3,928,704 | 12/1975 | Heidingsfeld et al. | 428/260 |
| 3,929,949 | 12/1975 | Day | 264/46.4 |
| 3,934,076 | 1/1976 | Smith | 174/87 |
| 3,937,870 | 2/1976 | Bumpstead | 174/87 |
| 3,985,951 | 10/1976 | Harris | 174/138 F |
| 4,010,994 | 3/1977 | Ayst . | |
| 4,025,717 | 5/1977 | Whittingham | 174/88 |
| 4,039,742 | 8/1977 | Smith | 174/87 |
| 4,070,543 | 1/1978 | Thompson et al. | 174/87 |
| 4,079,511 | 3/1978 | Grabbe | 29/627 |
| 4,102,716 | 7/1978 | Groves et al. | 155/48 |
| 4,151,364 | 4/1979 | Ellis | 174/84 C |
| 4,163,082 | 7/1979 | Romenesko | 428/447 |
| 4,168,258 | 9/1979 | Brauer | 260/33.6 |
| 4,171,998 | 10/1979 | Brauer | 156/48 |
| 4,176,239 | 11/1979 | Brauer | 174/23 C |
| 4,192,569 | 3/1980 | Macci . | |
| 4,196,308 | 4/1980 | Siden | 174/84 C |
| 4,208,788 | 6/1980 | Siden | 29/862 |
| 4,209,219 | 6/1980 | Proriette . | |
| 4,214,121 | 7/1980 | Chameski | 174/84 C |
| 4,231,986 | 11/1980 | Brauer et al. | 264/272 |
| 4,281,210 | 7/1981 | Brauer et al. | 174/23 C |
| 4,295,703 | 10/1981 | Osborne . | |
| 4,297,155 | 10/1981 | Jervis | 156/86 |
| 4,318,580 | 3/1982 | Fleisher . | |
| 4,326,767 | 4/1982 | Silbernagel et al. . | |
| 4,369,284 | 1/1983 | Chen | 524/476 |
| 4,371,757 | 2/1983 | Debortoli et al. | 179/98 |
| 4,375,521 | 3/1983 | Arnold | 523/173 |
| 4,406,510 | 9/1983 | Debortoli . | |
| 4,423,918 | 1/1984 | Filreis et al. . | |
| 4,425,017 | 1/1984 | Chan . | |
| 4,449,777 | 5/1984 | Barilseau . | |
| 4,466,843 | 8/1984 | Shimirak | 156/48 |
| 4,473,714 | 9/1984 | Browsell | 174/78 |
| 4,504,699 | 3/1985 | Dones et al. | 174/84 |
| 4,600,261 | 7/1986 | Debbaut | 174/76 X |
| 4,634,207 | 1/1987 | Debbaut | 174/76 X |
| 4,639,483 | 1/1987 | Billigmeier et al. | 524/296 |
| 4,647,717 | 3/1987 | Uken | 174/84 C |
| 4,721,832 | 1/1988 | Toy | 174/87 |
| 4,734,061 | 3/1988 | Randall et al. | 439/709 |
| 4,741,940 | 3/1988 | Reed | 174/76 X |
| 4,751,350 | 6/1988 | Eaton | 174/87 |
| 4,756,851 | 7/1988 | Billigmeier et al. | 252/272 |
| 4,846,721 | 7/1989 | Debruycker et al. | 439/411 |
| 4,864,725 | 9/1989 | Debbaut | 174/93 X |
| 4,875,870 | 10/1989 | Hardy et al. | 174/76 |
| 4,883,431 | 11/1989 | Uken et al. | 439/521 |
| 4,888,070 | 12/1989 | Clark et al. | 174/76 X |
| 4,909,756 | 3/1990 | Jervis | 174/76 |
| 4,963,698 | 10/1990 | Chang et al. | 174/77 R |
| 4,993,966 | 2/1991 | Levy | 439/411 |
| 5,140,746 | 8/1992 | Debbaut | 174/76 X |

FOREIGN PATENT DOCUMENTS

| | | |
|---|---|---|
| 52-66979 | 6/1977 | Japan . |
| 54-30609 | 9/1979 | Japan . |
| 1303581 | 1/1973 | United Kingdom . |
| 2020658A | 11/1979 | United Kingdom . |
| 2070658 | 9/1981 | United Kingdom . |

OTHER PUBLICATIONS

Brochure: Sylgarde ® 527 primerless silicone dielectric gel © 1980.

ASTM Designation 50/69 (79) "Standard Test Methods for Cone Penetration of Lubricating Grease".

M. Meyerstein "Outdoor Connector With Advanced Weather Resistance", Int'l Wire & Cable Symp. Proceedings, pp. 271-276 (1982).

I. E. Martin et al., "Connector Performance . . . Environment", Int'l Wire 2 Cable Symp. Proceeding, pp. 188-193 (1980).

Bell Northern Research, Ltd; Telesis, vol. 9 No. 4, 1982.

"Information about Materials for High Technology Applications" (Dow Corning Corp.'s 3-6527 A & B Silicone Dielectric Gel) Copyright 1980.

"Information about Silicone Encapsulants" (Dow Corning Corp.'s Q3-6527 A & B Silicone Dielectric Gel) 1977.

*Materials News* from Dow Corning May/Jun. 1978.

*Materials News* from Dow Corning Jul/Aug. 1977.

*Materials News* from Dow Corning Jul./Aug. 1974.

Dow Corning Silicone "Notes" (SYLGARD 51 Dielectric Gel) Feb. 1960.

Dow Corning's "Information about Electronic Materials" (SYLGARD 51 Dielectric Gel) Feb. 1965.

Dow Corning's "Information about Electrical/Electronic Materials" (SYLGARD 51 Dielectric Gel) Jan. 1969.

(List continued on next page.)

OTHER PUBLICATIONS

Dow Corning Corp's "Silicone Elastomers Application/Product Selection Guide for the Electrical/Electronic Industry," 1980.

"An Environmentally Sealed Terminal Block With Rotary Connection", Intl. Wire & Cable Symposium Proceedings, 1989 pp. 513–516.

"GE Silicones Selector Guide".

Dow Corning, "Information about Silicone Compounds" Copyright 1979.

"Gels and Their Sealing Applications in the Outside Plant," K. Dawes, C. Debbaut, A. P. P. Sutherland (International Wire & Cable Symposium Proceedings 1988).

"BIX: A Cross-Connect System Optimized for the Outdoors", Debortoli, Meyerstein & Velsher (in Telesis magazine, Bell-Norther Research Ltd. publication, 1982 issue Four.

"Environmental Protection Methods for the BIX Connector–Salt Fog Tests", W. P. Trumble (Bell–Northern Research) May 1979.

Bell–Northern Research Technical Report, "The Results of Reliability Testing of the BIX Outdoor Cross--Connect System", M. V. Meyerstein Jan. 1982.

Northern Telecom Sales Brochure, "BIX Stands Out on the Job, Not on Public Property; BIX Beats the Weather Machine" Jan. 1982.

Norther Telecom Document, "BIX Outdoor Cross--Connect System-Description" Dec. 10, 1981.

Northern Telecom Document, "BIX Outdoor Cross--Connect System, Ordering Information:" Dec. 11, 1981.

Northern Telecom Document "BIX Cross-Connect System, Installation, Testing and Servicing", Dec. 10, 1981.

"RTV 6159, Versatiles Transparent Silicone Gel", (General Electric).

"GE Silicones, RTV 6156, RTV 6166, RTV 6186 and RTV 6196, Silicone Dielectric Gels" (General Electric) (D–577) Copyright 1989.

"RTV6157, Transparent Silicone Gel GE Silicone Product Data" (D–578) Copyright 1985.

ANSI/ASTM D 1403, Standard Test Method for Penetration of Lubricating Grease Using One–Quarter and One–Half Scale Cone Equipment Reapproved 1974.

ANSI/ASTM D217 1982 Standard Test Methods for Cone Penetration of Lubricating Grease.

"An Introduction to Vistanex® LM Low Molecular Weight Polyisobutylene" POLYMERS Exxon Chemical Co. (1990/1992).

PROTECTED ELECTRICAL CONNECTOR

This application is a continuation of U.S. Pat. No. 07/396,575 filed Aug. 21, 1989 now U.S. Pat. No. 5,140,746, which is a continuation of U.S. Ser. No. 07/183,546, filed Apr. 18, 1988, now U.S. Pat. No. 4,864,725, which is a continuation of U.S. Ser. No. 07/038,415 filed Apr. 9, 1987, now abandoned which is a continuation of U.S. Ser. No. 06/756,559 filed Jul. 17, 1985, now abandoned which is a continuation of U.S. Ser. No. 06/507,433 filed Jun. 23, 1983, now abandoned which is a continuation-in-part of U.S. Ser. No. 06/504,000 filed Jun. 13, 1983, now U.S. Pat. No. 4,634,207 which is a continuation-in-part of U.S. Ser. No. 06/434,011 filed Oct. 12, 1982, now U.S. Pat. No. 4,600,261. The disclosures of Ser. No. 06/434,011 and 06/504,000 are incorporated by reference herein.

TECHNICAL FIELD OF THE INVENTION

The present invention relates to electrical contacts and more particularly to apparatus and methods for protection of such electrical contacts within an adverse environment. A particular embodiment relates to electrical connectors in which connection between electrical wires is effected by mechanical deformation of the connector.

Background of the Invention

For the purposes of the instant application, an electrical contact refers to an electro-mechanical device that may be employed when it is desired to readily connect (or disconnect) a first-insulated conductor to (or from) a second insulated conductor. Such a device is included, for example, in a conventional telephone circuit wire connector or in a conventional telephone electrical termination block of the type that provides telephone service to a customer.

A wide variety of substrates require protection from adverse environmental conditions, including moisture, insects, dirt, plant life and corrosion deposits. In some cases, especially when electrical contacts are to be protected, it is desirable to provide a removable protective cover over the substrate, so that it is possible easily to reenter and work on the sealed substrate. It is known to use greases to protect electrical contacts, the grease being contained in a container which is applied to the electrical contact(s)-see for example U.S. Pat. No. 3,897,129 (Farrar). However, the grease is a thixotropic fluid, which places limitations on the ways in which it can be used. Furthermore, when reentry to the sealed contact is required, when the container is removed, grease remains coated on the contact(s) and must be cleaned off before electrical work can begin. It is also known to encapsulate electrical contacts within a container be means of a two-part liquid composition prepared by mixing ingredients which will react slowly together. Before the ingredients have gelled, the mixture is poured into the container, where it cures in situ to form a hard gel-see U.S. Pat. Nos. 4,375,521 (Arnold) and 4,102,716 (Graves). However, this procedure involves preparation of the liquid composition at the site, delay while the composition gels, and the need to provide a container around the contact(s), into which the composition can be poured. Furthermore, when reentry to the encapsulated contacts is required, the gelled composition cannot easily be removed.

In order to explain how an electrical contact is included in a telephone electrical termination block, attention is directed to FIG. 1 which shows a typical termination block 10. The termination block 10 includes a plurality of binding posts 12 which are, in fact, the electrical contacts. The binding posts 12 each comprise a small screw-type contact that facilitates the connection or disconnection of the first and second insulated conductors. Here, the first conductor may comprise a drop or service wire 14 that is wrapped around the screw-type contact so as to provide a connection between the customer and the termination block 10. The second conductor, on the other hand, may comprise a cable stub 16, which is pre-wired to a hermetically sealed portion of the termination block 10.

Although an end lead of the cable stub 16 is hermetically sealed within a portion of the termination block 10, the binding posts 12 (which connect one end of the service wire 14) may be exposed to the outside environment. The binding posts 12 are typically kept in this exposed condition in order to facilitate a craftsperson's reentry to the termination block 10 in order to effect repairs or change a service connection.

If the binding posts 12 remain exposed but unprotected from the outside environment, they may be affected by environmental agents including dirt, plant life, moisture, corrosion deposits and insects. These agents, however, can be adversative to the termination block 10 because they may effect a conductive bridge between some or all of the binding post contacts. This conductive bridge, in turn, may provide a means for the creation of noise and may produce an electrical short-circuit within the termination block. It is noted in particular, that such termination blocks that are left unprotected within humid or moist environments can incur a critical loss of insulation resistance between binding post contacts which can result in a temporary or permanent disruption of termination block operation or customer service.

In order to avoid disruption of service, therefore, it is important that the termination block be maintained so that it is resistant to the cited adverse environmental agents and can remain moisture insensitive. Consequently, it is important that the binding posts contacts (or electrical contacts) be provided with a protection means (of the type indicated generally by numeral 18 in FIG. 1) that insures there reliable and safe operation within an otherwise adverse and moisture-laden environment.

In order to select an appropriate protection means for electrical contacts, it is advantageous to realize the following design objectives. Thus, the protection means should not obstruct or delay a craftsperson's access to the reentrable electrical contacts. At the same time, and as its name suggests, the protection means should protect the electrical contacts from the above described adverse environmental agents, including a high humidity environment. To these design objective ends, it is advantageous that the protection means utilize materials that are non-hazardous, possess acceptable electrical properties including a desired insulation resistance and remain substantially inert toward a molded plastic substrate which typically houses the electrical contacts.

Embodiments of the present invention fulfill this need and satisfy the design objectives by providing a unique apparatus and method for protection of electrical contacts. The apparatus of the present invention does not obstruct or delay a craftsperson's repeated reentrys to the electrical contact. At the same time, the present invention safely protects the electrical contacts even when they are exposed to an adverse environment. The present invention may consequently be employed with a variety of electro-mechanical devices like connectors or termination blocks where it is important to have ready access to the device while insuring, nevertheless, that the device is protected from the adverse environment.

It is also well known to splice (i.e. connect) electrical wires by placing them within a connector and then permanently deforming the connector by mechanical pressure-see for example U.S. Pat. No. 4,208,788 to Siden. If the electrical wires so spliced are to be used in a corrosive, moist or hazardous environment, it is desirable to provide an environmental seal in association with the pressure connector in order to maintain an acceptable electrical connection between the electrical wires.

Such environmental seals are known and include, for example, a special box which is designed to house the wire splice. In practice, however, the special box does not provide a hermetic seal; ultimately, moisture and/or other foreign substances may permeate the special box and induce corrosion within the wire splice.

Other known environmental seals include a method of covering the spliced wires with a silicone grease. The silicone grease, however, is unsatisfactory since it can coat apparatus that should remain clean, and is displaced by vibration.

Environmental seals further include a crimp splicer wherein there is an associated insulating heat shrinkable sleeve which is adapted to retain a crimp barrel therein. In practice, the heat shrinkable sleeve may be shrunk down around the barrel and electrical wires in order to protect the splice from the environment. In some cases, however it is disadvantageous or even prohibited, to employ a heating unit to heatshrink the sleeve.

Summary of the Invention

Accordingly, it is an object of the present invention to provide a protection apparatus for electrical contacts.

It is a feature of the present invention that it enable a craftsperson to make numberable reentrys to the electrical contacts while ensuring that the electrical contacts are protected when they are otherwise located in an adverse environment.

It is an advantage of the present invention that it may be employed with electro-mechanical devices like termination blocks that include electrical contacts.

In accordance with the present invention, there is provided a protection apparatus for an electrical contact. The apparatus includes an insulating gel that is characterized by a cone penetration value frown approximately 150 to 350 ($10^{-1}$ mm); an ultimate elongation of at least approximately 200%; a maximum tensile strength of approximately 20 psi; and a cohesive strength greater than its adhesive strength. The apparatus further includes a first means to contain the gel, a second means to retain the gel within the first means and a force means which acts on the first means so that the gel is maintained in compressive contact with the electrical contact and substantially encapsulates a conductive portion of the electrical contact.

I have now discovered that excellent encapsulation of electrical contacts (and other substrates) can be obtained through the use of gels which have been pre-formed in the absence of the substrate (and like compositions); the pre-formed gel and the substrate to be encapsulated are pressed against each other, thus deforming the gel into close and conforming contact with the substrate. Preferably, at least a part of the deformation is elastic deformation. The preferred properties of the gel depend upon the substrate to be encapsulated, as further discussed below, but I have found that in all cases, it is essential for the gel to be relatively soft by comparison with the gels formed in situ in the known processes. Thus the gels formed in in situ processes have cone penetration values of less than 75, whereas the novel encapsulants of this invention have cone penetration values of at least 100. Cone penetration values give in this specification are expressed in units of $10^{-1}$ ram and are measured by ASTM D217-68 at 70° F. ±5° F., on an undisturbed sample using a standard 1:1 scale cone (cone weight 102.5 g. shaft weight 47.5 g), the penetration being measured after 5 seconds. In addition, the novel encapsulants should have an elongation of at least 200%. Elongation values given in this specification ace ultimate elongations measured by ASTM D638-80 at 70° F. ±5° F., using a Type 4 die to cut the sample and at a speed of 50 cm/minute.

The novel encapsulant can be adherent to any suitable support member. Especially when it is desirable that the encapsulant should be removable from the electrical contact or other substrate which it is protecting, the encapsulant preferably has an adhesive strength to the substrate which is less than its adhesive strength to the support member and less than its cohesive strength, so that the encapsulant can be cleanly removed front the substrate merely by separating the support member and the substrate, leaving little or none of the encapuslant on the substrate. When the encapsulation of the substrate involves pushing at least part of the substrate through the encapsulant so that the encapsulant is parted and then flows back to form a seal on the other side of the substrate, the seal is a plane of weakness which will in many cases separate cleanly when the encapsulant is removed. This is in contrast to the situation when an encapsulant is gelled in situ, when no such plane of weakness exists.

In one aspect, the present invention provides an apparatus for providing a protective covering over a substrate, the apparatus comprising a support member and an encapsulant, the encapsulant being adherent to the support member and being composed of a material which has a cone penetration value of 100 to 350 and an ultimate elongation of at least 200%.

In another aspect, the invention provides a process for providing a protective covering over a substrate, which process comprises pressing together the substrate and an apparatus as define above, the apparatus and the substrate being pressed together so that the encapsulant contact the substrate and is deformed into close and conforming contact therewith.

I have now also discovered an in, proved electrical pressure connector, which protects the electrical wires from a corrosive, moist or hazardous environment. The apparatus of the present invention is easy and convenient to employ and dispenses with a need for grease or a heat unit.

In one aspect, the present invention provides a connector, an insulating sleeve adapted to retain the connector, and an encapsulant disposed within the insulating sleeve and/or the connector, the encapsulant having a cone penetration value of 150 to 350 and an ultimate elongation of at least 200%.

In another aspect, the present invention provides a process of splicing electrical wires, comprising the steps of:
(a) inserting end sections of a at least two electrical wires into an apparatus that comprises:
  (i) an electrical connector,
  (ii) a deformable insulating sleeve that surrounds and retains said electrical connector; and
  (iii) an encapsulant disposed within said insulating sleeve, said encapsulant having a cone penetration value of 100 to 350 ($10^{-1}$ mm) and an ultimate elongation of a least 200%; and
(b) exerting pressure on said electrical connector through said insulating sleeve, thereby permanently deforming the connector to electrically connect said electrical wires and encapsulate the electrical connection with the encapsulant.

The end sections of the wires can be stripped of insulation before being inserted into the connector, which, when it is crimped, mechanically deforms the end sections so that they are in physical as well as electrical contact. Alternatively the insulation can be left on the wires, in which case the connector mus comprise an insulation displacing member which, when the connector is crimped, displaces insulation on the end sections and effects electrical connection between the wires.

BRIEF DESCRIPTION OF THE DRAWING(S)

These and other features of the present invention will be more clearly understood from a consideration of the following description taken in connection with the accompanying drawings in which:

FIG. 1 provides a perspective view of a conventional telephone electrical termination block.

FIG. 2 provides an exploded view of one embodiment of a protection apparatus made in accordance with the principles of the present invention.

FIGS. 3a and b show alternative embodiments of the present invention.

FIG. 4 is a cross-sectional view of an alternative embodiment of the present invention; and FIG. 5 is a cross-sectional view of still another embodiment of the present invention.

DESCRIPTION OF THE PREFERRED EMBODIMENTS

Figure 1:
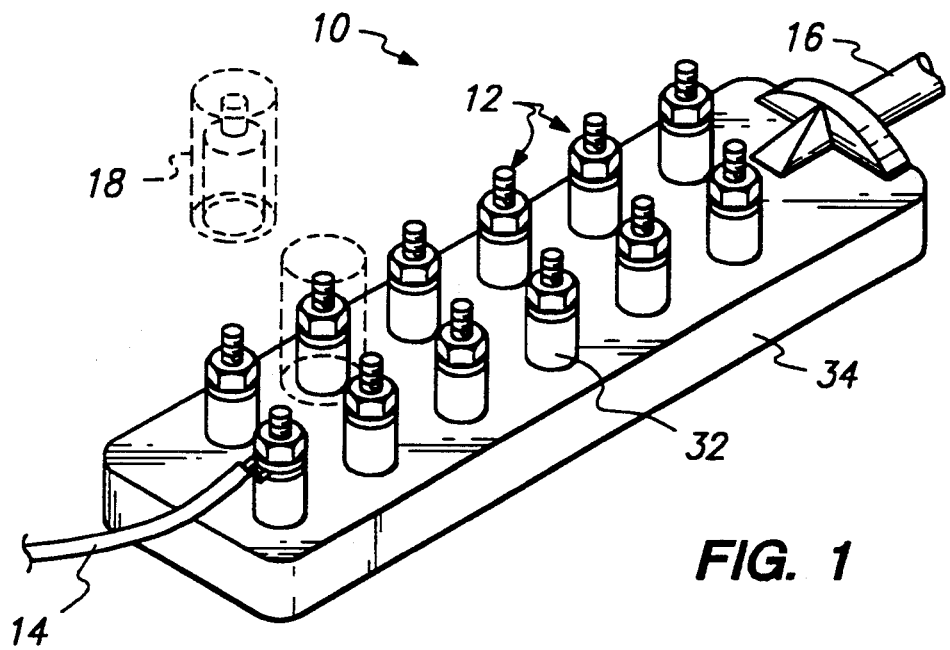
Figure 2:
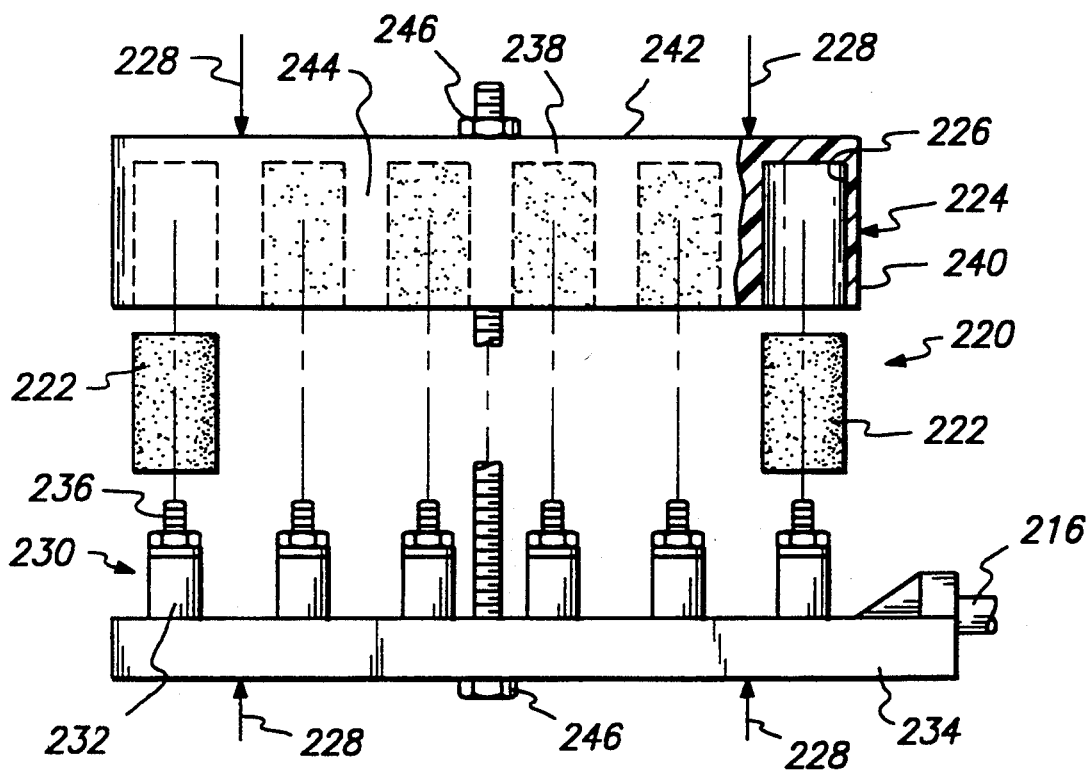

Reference is now made to FIG. 2 which provides an exploded view of one embodiment of a protection apparatus 220 made in accordance with the principles of the present invention. As shown in FIG. 2, the apparatus 220 includes these component elements: an insulating gel 222 (whose further particular characteristics are set forth below); a first means 224 to contain the gel 222 (here shown as a partitioned housing); a second means 226 to retain the gel within the first means 224 (i.e. the housing); and a force means 228 (shown symbolically in FIG. 2 as force vectors). The force means 228 acts on the first means 224 so that the gel 222 is maintained in compressive contact with an electrical contact 230 that is located on a support substrate 232 of a conventional termination block 234. At the same time, the force means 228 acts on the first means 224 so that the gel 222 substantially encapsulates a conductive portion 236 of the electrical contact 230.

The protection apparatus 220 shown in FIG. 2 has the following unique feature: if there is a release of the force means 228 and a disengagement of the first means 224 from the termination block 234, the gel 222 remains substantially with the first means 224 (i.e. the partitioned housing). The gel 222, moreover, is cleanly as well as immediately removed from the electrical contact 230. This unique feature enables the craftperson's to reenter the termination block 234 numerable times to effect repairs or change service wires connected to the electrical contact 230. In all such cases of reentry, the gel 222 remains substantially in the partitioned housing so that the craftperson can make repairs without obstruction or delay. After any repair is made, the craftsperson insures that the electrical contact 230 is environmentally protected by a method that includes the steps of:

1. providing an insulating gel 222;
2. providing a first means 224 of containing the gel 222;
3. providing a second means 226 for retaining the gel 222 within the first means 224; and
4. applying a force means 228 for acting on the first means 224 so that the gel 222 is maintained in compressive contact with the electrical contact 230 and substantially encapsulates the conductive portion 236 of the electrical contact 230.

There is now provided, in sequence, a more detailed description of the component elements set forth above for the protection apparatus 220 of the present invention.

The insulating gel 222 is particularly characterized by the following included features: (1) a cone penetration value from approximately 150 to 350 ($10^{-1}$ mm); an ultimate elongation of a least approximately 200%; a maximum tensile strength of approximately 20 psi; and a cohesive strength greater than its adhesive strength. (Note that the stated parameters are provided in accordance with the American National Standard designation ASTM D217 and ASTM D638 for the cone penetration and elongation parameters, respectively.)

The insulating gel 222 characterized by these stated features is prepared by extending a conventional aliphatic polyurethane composition with an admixture of mineral oil and vegetable oil from approximately 70 to 80%; the ratio of mineral oil to vegetable oil being approximately 0.7 to 2.4. Such an insulating gel 222 is tacky and is hydrolytically stable, moisture insensitive and substantially inert towards the support substrate 232. Additionally, the gel 222 is electrically insulating as it has a volume resistivity of at least approximately 109 ohms centimeter. The gel 222 may also be provided with catalyst and other known additives such as moisture scavenger (e.g. benzoyl chloride), antioxidants, pigments and fungicides, etc. (all well known in the art). Other specific compositions for an insulating gel are conceivable and may be employed within the scope of the present invention. For example, the composition can be realized as a nontacky gel.

As described above, the protection apparatus 220 includes the first means 224 to contain the gel 222. In FIG. 2, the first means 224 is realized by a partitioned housing. The partitioned housing includes side walls 238, end walls 240, a bottom wall 242 and a plurality of partitions 244. In this embodiment, each partition included within the plurality of partitions 244 encapsulates an electrical contact 230. The partitioned housing may be composed of a plastic material.

The first means 224 may also be realized by a nonpartitioned housing or "open-through" type design (not shown). Other specific embodiments for the design and type of material to be employed in the realization of the first means 224 are conceivable and may be made within the scope of the present invention as heretofore described.

It is also indicated above that the protection apparatus 220 includes the second means 226 to retain the gel 222 within the first means 224 (i.e. the partitioned housing). In general, the second means 226 to retain the gel 222 may include means to provide a surface area of the first means greater than a surface area of the electrical contact 230. To this end, the second means 226 may be realized by a conventional surface treatment process that includes abrasion of the surface wall areas of the partitions or the inclusion of material protrusions (not shown) within the included partitions. The second means 226 to retain the gel 222 further includes chemical surface activation procedures such as a corona treatment or a chemical treatment to enhance adhesion of the gel 222 to the first means 224.

Finally, it is indicated above that the protection apparatus 220 includes the force means 228, shown symbolically as force vectors in FIG. 2. In one embodiment of the present invention, the force means 228 is realized as a conventional nut and bolt assembly 246 which acts to insure that the gel 222 is maintained in compressive contact with the electrical contact 230 and that the gel 222 substantially encapsulates the conductive portion 236 of the electrical contact 230. Optimal results are secured if the force means 228 (e.g. the nut and bolt assembly) operates as a directional force that acts along an axis defined by the electrical contact 230. Other specific embodiments (not shown) that realize the force means 228 include conventional tie wraps, string or bailing wire assemblies. It is noted, moreover, that the force means 228 may be realized by a force that is substantially non-varying in time or is dynamic.

The encapsulants used in the present invention have cone penetration values of 100 to 350, with values of 150 to 350, especially 200 to 300, being preferred for processes in which the pressure exerted on the encapuslant during installation is relatively low, as for example in the encapsulation of electrical terminals as described in connection with the drawing. When the volume of the encapsulant (or each mass of encapsulant) is relatively large (e.g. more than 3 cc), the cone penetration value of the encapsulant is preferably 200 to 250. When the volume is relatively small (e.g. less than 3 cc), the cone penetration value is preferably 250 to 350.

The elongation of the encapsulant is at least 200%, and substantially higher values are preferred, e.g. at least 500%, particularly at least 750%. The tensile strength of the encapsulant is generally less, often very much less, than 20 psi (measured by ASTM D638-80 under the same conditions as the elongation).

The elastic modulus of the encapsulant is also significant, since it affects the ability of the encapsulant to make intimate contact with the substrate. When measured at 70° F. ±5° F., using a parallel plate rheometric test at a frequency of 1 Hz, the encapsulant generally has an elastic modulus less than $10^7$ dynes/cm$^2$, preferably less than $10^6$ dynes/cm$^2$, particularly less than $10^5$ dynes/cm$^2$.

Suitable materials for the encapsulant (which is usually electrically insulating, but is not necessarily so for some possible uses of the invention e.g. when non-electrical substrates are being protected) can be made by gelling curable polyurethane precursor materials (as described for example in the patents referenced above) in the presence of substantial quantities of a mineral oil, a vegetable oil or a plasticizer, or a mixture of two or more of these. Thus I have obtained excellent results using encapsulants prepared by gelling components which are commercially available for the preparation of polyurethane gels in situ, the gelation being carried out, however, in the presence of a suitable amount e.g. 30 to 70% by weight, of a suitable plasticizer, e.g. a trimellitate, or in the presence of a suitable animal or vegetable oil e.g. 80 to 60%, preferably 80 to 70%, by weight of a mixture of mineral and vegetable oils in which the ratio by weight of mineral oil to vegetable oil is 0.7 to 2.4. Other suitable encapsulants can be prepared by curing reactive silicones with non-reactive extender silicones.

A wide variety of support members are useful in the present invention. In some cases a conventional rectangular container, having side walls, end walls and a bottom wall, is satisfactory. When a plurality of adjacent contacts are to be encapsulated, it is often useful for the support member to comprise a plurality of individual open containers, which are connected to each other, e.g. through a flexible connection means, and each of which contains a separate mass of encapsulant. The separate containers can be applied simultaneously or sequentially to the contacts. The support member can be of any material, but preferably it is composed of an organic polymer or some other insulator. The support member can be recoverable, preferably heat-recoverable, in which case the process for applying the protective covering to the substrate includes a step in which the support member is recovered. When using a recoverable substrate, the elastic modulus of the encapsulant is particularly important, but the elongation can be substantially, less than 200%, e.g. as little as 50%, though preferably at least 100%

Especially when at least part of the deformation of the encapsulant is elastic deformation, it is often necessary to provide a force member for maintaining the encapsulant in compressive contact with the substrate. The force member is preferably secured to or forms part of the support member, but can be separate from it. The force member can be such that it becomes secured to the substrate when the substrate and the protective apparatus are pressed together. For example the force member can lie within the encapsulant and engage the substrate to which the encapsulant is applied. In the embodiment of the present invention as shown in FIG. 2, the force means 228 is considered to be an independent element which acts on a concentrated load (i.e. the first means 224 that contains the encapsulant). The force developed by the force means 228 is effectively transmitted and distributed by way of the first means 224 so that the encapsulant 222 maybe in compressive contact with each of a plurality of electrical contacts 236.

Figure 3A:
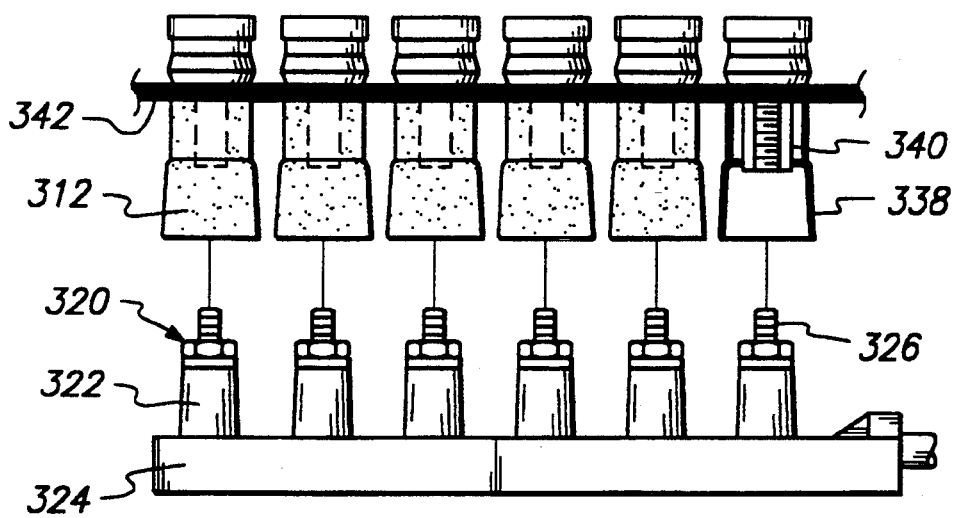

This alternative embodiment of the present invention is shown in one of its aspects in FIG. 3a and includes a means 338 to contain and retain the encapsulant 312 and to develop a force to maintain the encapsulant 312 in compressive contact with the electrical contact 320 and the support substrate 322. The means 338 is realized by way of a structure that includes a housing that has a generally bell shaped configuration. Thus, the housing has a narrow necked portion that opens up at one end so as to be able to fit over the electrical contact 320. Integral to the housing is a split retaining nut member 340 that has an internal threaded portion that is complementary with the threads of the electrical contact 320. The member 340 is split so that it may be pushed axially onto the electrical contact 320, without threading it during this pushing action. On the other hand, the member 340 is internally threaded so that it can grip the electrical contact 320 upon the cessation of the pushing action, thus realizing the force that maintains the encapsulant 312 in compressive contact with the electrical contact 320 and the support substrate 322.

Figure 3B:
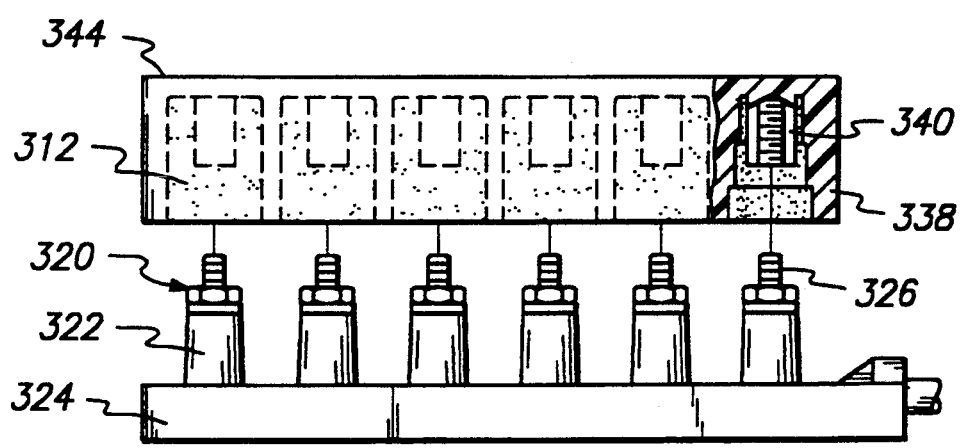

In sum, the alternative embodiment of the present invention shown in FIG. 3a includes the means 338 which (1) contains the encapsulant 312; (2) retains the encapsulant 312 (in the manner established above); and (3) develops a force to maintain the encapsulant 312 in compressive contact with the electrical contact 320 and the support substrate 322. The means 338, as shown by way of FIG. 3a embodiment, may be realized by a conventional polymeric or elastomeric material. A plurality of the means 338 elements, moreover, may be connected together by way of a connecting ribbon 342. The ribbon 342 facilitates the job of the craftsperson, wherein an array of electrical contacts 320 are serviced as a group, and re-entry is effected simply by pulling the ribbon 342 away from the termination block 324. To the same end, note another embodiment of the present invention, shown in FIG. 3b, wherein the means 338 is realized by a uniblock device 344 that is molded to fit over the entire termination block 324.

The present invention, as heretofore disclosed, provides apparatus and method for protection of electrical contacts. The principles of the present invention, however, are more general and extend to apparatus and method for providing a protective covering over any substrate e.g. the support substrate 322. The generalized apparatus and method of the present invention is now disclosed.

As generalized, also a method of the present invention includes a process for providing a protective covering over a substrate, and comprises the steps of:
  (a) pressing together the substrate and a protective member comprising a support member and an encapsulant which is adherent to the support member. The encapsulant preferably has cone penetration value of 150 to 350 ($10^{-1}$ mm) and an ultimate elongation of at least 200% and an adhesive strength to the substrate which is less than its adhesive strength to the support member and less than its cohesive strength. The protective member and the substrate are pressed together so that the encapsulant contracts the substrate and is deformed into close and conforming contact with the substrate; preferably at least a part of the deformation is elastic deformation; and
  (b) maintaining the encapsulant in contact with the substrate.

Figure 4:
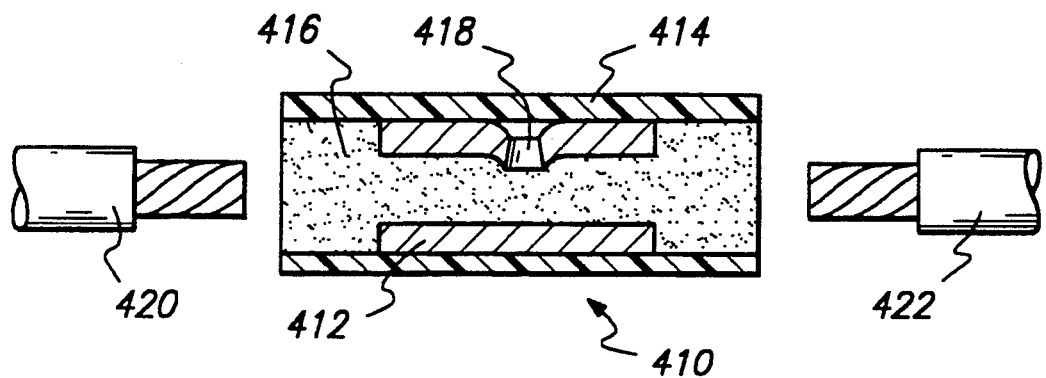

Still another embodiment of the invention is described herein mainly by reference to an in-line crimp splicer as shown in FIG. 4, but it is to be understood that the invention extends to electrical pressure connectors, generally, and therefore further encompasses e.g. pigtail connectors (or wire joints). It is also noted that the invention may be practiced when it is desired to connect two or more electrical wires.

Attention, accordingly, is directed to FIG. 4, which shows a cross-sectional view of a crimp splicer 410. The crimp splicer 410 includes three elements; a connector 412, an insulating sleeve 414 and an encapsulant 416. These elements are now discussed in detail, but it is to be understood that the various features disclosed with reference to FIG. 4 are also applicable, mutaris mutandis, to other pressure connectors of the invention.

The connector 412 is preferably cylindrical or barrel shaped and consists of a ductile metal which is a good conductor and is capable of being deformed with a crimping device (not shown). Suitable metals are copper, aluminum or brass. The connector 412 is also provided with a centrally located conductor stop 418 formed by perforating one side of the wall of the connector 412 and forcing a portion of the wall into the interior of the connector 412.

The insulating sleeve 414 is generally cylindrically-shaped and has a bore formed therein which runs the length of the sleeve. The sleeve 414 is shaped and sized to enable mechanical retention of the connector 412 disposed within the bore of the sleeve 414. Suitable materials for the sleeve 414 include nylon and polyvinylidene fluoride, since the necessary crimping force can be applied through these materials, in an appropriate manner well known in the art, without damage to the insulating sleeve or loss of retention of the connector 412.

The encapsulant 416 has a cone penetration value of 100 to 350 ($10^{-1}$ mm), preferably 100 to 250. (Note that the cone penetration value is determined in accordance with the American National Standard Designation ASIM D217-68 on an undisturbed sample at 70° F. ±5° F. using a standard 1:1 scale cone (cone weight 102.5 g, shaft weight 47.5 g), the penetration being measured after 5 seconds. Further, the encapsulant 416 has an ultimate elongation of a least 200%, especially at least 500%; and generally has a maximum tensile strength of approximately 20 psi. (Note that these parameters are determined in accordance with the American National Standard Designation ASTM D638-80, at 70° F. ±5° F., using a Type 4 die to cut the sample and at a speed of 50 cm/minute).

The encapsulant 416 may be prepared by gelling a liquid mixture comprising suitable gel precursor materials, e.g. polyurethane or polysiloxane precursor materials, together with suitable reactive or nonreactive extenders. For example, suitable encapsulants can be made by gelling a mixture comprising conventional curable polyurethane precursor materials in the presence of substantial quantities of a mineral or vegetable oil or a mixture thereof (e.g. in amount 60 to 80%) or a suitable plasticizer, e.g. a trimellitate such as n-ocytl-n-decyl trimellitate (e.g. in amount 30 to 70%). A suitable reactive extender for polyurethane precursors is a mixture of mineral and vegetable oils in which the ratio by weight of mineral oil to vegetable oil is 0.7 to 2.4 the mixture of oils being present in amount 80 to 60%, preferably 80 to 70% by weight based on the total weight of the polyurethane precursor materials and the mixture of mineral and vegetable oils. The encapsulant 416 may contain known additives such as moisture scavengers (e.g. benzoyl chloride), antioxidants, fillers, pigments, and fungicides. Especially when the wires are crimped into direct physical contact, the encapsulant can contain abrasive fillers which will pierce through any oxide or other passivating layer on the conductors, particularly aluminum conductors, especially in medium and high voltage joints. Other specific compositions for encapsulant 416 are conceivable and may be employed within the scope of the present invention. For example, the composition may be prepared by curing reactive silicones dissolved in non-reactive extender silicones. The encapsulant 416 is electrically insulating and preferably has a volume resistivity of at least 10⁹ ohms centimeter. Additionally, the encapsulant 416 is hydrolytically stable, moisture insensitive, substantially inert towards the insulating sleeve 414 and tacky.

Note that it is advantageous to dispose the encapsulant 416 within the sleeve 414 so that it substantially fills up the bore which runs the length of the sleeve 414. In this manner, the electrical wires 420 and 422 penetrate the encapuslant 416, which then seals behind the inserted wires 420 and 22. Moreover, the encapsulant 416 is voided from the area of electrical contact by the mechanical pressure generated during the crimping step (b) above. In this way, consequently, the present invention provides an electrical splice: the encapsulant 416 ensures that the splice protects the electrical wires 420 and 422 from a corrosive, moist or hazardous environment. In an alternative embodiment of the present invention, not shown, the sleeve 414 is provided with flexible end-guards which shield and protect the encapsulant 416 from dust and incidental contact with solvents.

Figure 5:
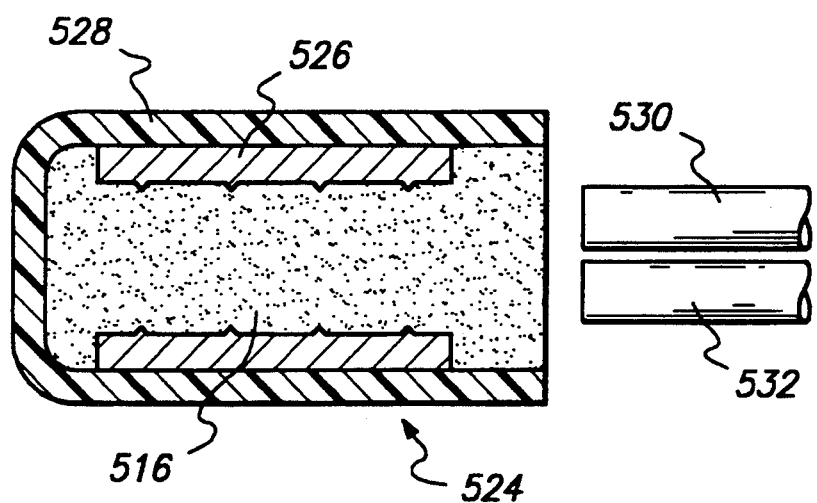

The apparatus of the present invention also extends to a "B-wire" connector 524 of the type shown in FIG. 5. Here, a connector 526 which is covered with an insulated layer 528 is adapted to receive insulated electrical wires (numerals 530, 532). The apparatus comprises an insulation displacing member which, when the connector 524 is crimped around insulated electrical wires placed within the connector, displaces insulation on the electrical wires and effects electrical connection between the wires.

The present invention, in summary, may be employed to provide a protection apparatus for electrical contacts. Although specific embodiments of the present invention have been described herein, it will be obvious to those skilled in the art that various modifications may be made without departing from the spirit of this invention. With such included modifications, the present invention is suitable for employment with a wide variety of devices including termination blocks, telephone connectors or conventional splice connectors. In all such cases of employment, a craftsperon can make numerous reentrys to the device while ensuring that the electrical contacts therein are protected when they are otherwise located in an adverse environment. Additional embodiments of the present invention in summary, may also be employed to maintain an acceptable electrical connection between spliced wires by encapsulating and hence sealing the electrical connection from an adverse environment. Although specific embodiments of the present invention have been described herein, it will be obvious to those skilled in the art that various modifications may be made without departing from the spirit of the invention.

With the forgoing in mind, it is understood that the invention be accorded the full scope of the appended claims.

What is claimed is:

1. A device for protecting an electrical contact and wire connection, comprising:
   (1) a gel formed prior to making the connection between the electrical contact and wire, said gel having an elastic modulus of less than $10^6$ dynes/cm², an ultimate elongation of at least 200%, and is capable of undergoing elastic deformation around the electrical contact and wire;
   (2) a container for the gel; and
   (3) a force member adapted to cooperate with and act on said container to move the container and gel from a first position to a second position whereby upon connection of the electrical contact and wire said gel within the container is elastically deformed and maintained in direct engagement with said electrical contact and wire so that said electrical contact and wire connection is environmentally sealed.

2. The device according to claim 1 wherein said gel is initially formed in contact with said container and said gel has a cone penetration of 150 to 350 ($10^{-1}$ mm).

3. The device according to claim 2 wherein the elastic modulus of said gel is less than $10^5$ dyne/cm².

4. The device according to claim 3 wherein said container includes an electrical contact and said gel, said gel having an adhesive strength to the wire to be sealed which is less than the gel's cohesive strength.

5. The device according to claim 1 wherein said container houses an electrical contact and where said force member comprises in part a bolt member acting in combination with said container.

6. The device according to claim 5 wherein said gel has a cone penetration of 150 to 350 ($10^{-1}$ mm).

7. The device according to claim 6 wherein the electrical contact is an insulation displacement electrical contact contained within said container.

8. A device for protecting an electrical contact and wire connection, comprising
   (1) a gel formed prior to making the connection between the electrical contact and wire, said gel having an elastic modulus of less than $10^6$ dynes/cm², and an ultimate elongation of at least 200%;
   (2) a container for the gel: and
   (3) a force member adapted to cooperate with and act on said container to move the container and gel or an electrical contact containing member from a first position to a second position such that upon connection of the electrical contact and wire said gel within the container is elastically deformed and maintained in direct engagement with said electrical contact and wire so that said electrical contact and wire connection is environmentally sealed; said force member also adapted to move the container or an electrical contact containing member from said second position to said first position whereby said electrical contact and wire may be disconnected; and wherein said gel has a cohesive strength greater than its adhesive strength whereby upon disconnection of the electrical contact and wire, said gel remains substantially within said container.

9. The device according to claim 8 wherein said gel a cone penetration of 150 to 350 ($10^{-1}$ mm).

10. The device according to claim 9 wherein said gel is initially formed in contact with said container and electrical contact.

11. The device according to claim 10 wherein said force member is selected to include a member from the group consisting of a nut, a bolt, and combinations thereof.

12. The device according to claim 11 wherein said container is composed of an organic polymeric material and said gel is an aliphatic polyurethane composition selected from the group consisting of a plasticized polyurethane, an oil-extended polyurethane.

13. The device according to claim 10 wherein said gel is a silicone gel with an elastic modulus less than $10^5$ dyne/cm$^2$.

14. The device according to claim 8 wherein said gel is selected from the group consisting of gels substantially inert towards the wire; hydrolytically stable moisture insensitive and electrically insulating gels; tacky gels; non-tacky gels; and gels with combinations of properties thereof.

15. A device for protecting an electrical contact and wire connection wherein the contact is mounted in a base and the wire is external to the base. comprising:
(1) a gel formed prior to making the connection between the electrical contact and wire. Said gel having an elastic modulus of less than $10^6$ dynes/cm$^2$ and an ultimate elongation of at least 200%;
(2) a container for the gel; and
(3) a force member adapted to move the container relative to said base between a first unsealed position to permit connection of the electrical contact and wire and a second environmentally sealed position wherein said gel within the container is elastically deformed and maintained in direct engagement with said electrical contact and wire connection.

16. The device according to claim 15 wherein said gel having a cone penetration of 150–350 ($10^{-1}$ mm).

17. The device according to claim 16 wherein said gel is initially formed in contact with said container.

18. The device according to claim 15 said gel having a cone penetration value of 150–350 ($10^{-1}$ mm), said gel having an adhesive strength to the wire to be sealed which is less than the gel's cohesive strength.

19. The device according to claim 15 wherein said container surrounds an electrical contact and said gel is initially formed in contact with said container and electrical contact and said gel has a cone penetration value of 150–350 ($10^{-1}$ mm).

20. The device according to claim 15 wherein with said container is associated with an insulation displacement electrical contact and said gel, said gel having an adhesive strength the wire to be sealed which is less than the gel's cohesive strength and an elastic modulus of less than $10^5$ dynes/cm$^2$ and a cone penetration value of 150–350 ($10^{-1}$ mm), and said force member includes a bolt member.

21. A reusable apparatus for environmentally protecting a wire and electrical contact connection, said apparatus comprising: a reusable receptacle for housing the wire and electrical contact connection:
a gel formed prior to making the wire and electrical contact connection, said gel being disposed within said receptacle and having an ultimate elongation of at least 200%, an elastic modulus of less than $10^6$ dynes/cm$^2$, and a cone penetration of 150–350 ($10^{-1}$ mm);
a repeatedly activateable force member assembled with said receptacle to cause elastic deformation of said gel at said wire and electrical contact connection when said force member is activated to environmentally seal the connection.

22. The reusable protection apparatus of claim 21 wherein said force member acts to move said receptacle from a first position to a second position.

23. The reusable protection apparatus of claim 22 wherein said receptacle is completely separable from said electrical contact.

24. The reusable protection apparatus of claim 21 wherein said force member acts to move the electrical contact from a first unsealed position to a second sealed position.

25. A reusable protection apparatus for environmentally protecting a plurality of wire and electrical contact connections said apparatus comprising:
a plurality of wire and electrical contact connections;
at least one reusable receptacle for isolating one of said electrical contact and wire connections;
a gel formed prior to making the wire and electrical contact connection, said gel being disposed within said receptacle and having a cone penetration of about 150 to about 350 ($10^{-1}$ mm) and an ultimate elongation of at least about 200% and an elastic modulus of less than $10^6$ dynes/cm$^2$; and
a repeatedly activateable force member assembled with said receptacle to cause compression of said gel at said wire and electrical contact connection when said force member is actuated whereby the sealing by the gel of the wire and electrical contact connection prevents shorting between adjacent electrical contact wire connections.

* * * * *

UNITED STATES PATENT AND TRADEMARK OFFICE
CERTIFICATE OF CORRECTION

PATENT NO. : 5,357,057
DATED : October 18, 1994
INVENTOR(S) : Debbaut

It is certified that error appears in the above-indentified patent and that said Letters Patent is hereby corrected as shown below:

Column 4, line 15, delete "ram" and insert --mm--.

Column 4, line 21, delete "ace" and insert --are--.

Column 5, line 6 between "of" and "at" delete "a".

Column 5, line 25, delete "mus" and insert --must--.

Column 6, line 49, delete "109" and insert --$10^9$--.

Column 7, line 62, delete "106" and insert --$10^6$--.

Column 11, line 2, delete "109" and insert --$10^9$--.

Signed and Sealed this

Twenty-first Day of February, 1995

Attest:

BRUCE LEHMAN

Attesting Officer

Commissioner of Patents and Trademarks